(12) United States Patent
Shen et al.

(10) Patent No.: US 6,563,142 B2
(45) Date of Patent: May 13, 2003

(54) REDUCING THE VARIATION OF FAR-FIELD RADIATION PATTERNS OF FLIPCHIP LIGHT EMITTING DIODES

(75) Inventors: Yu-Chen Shen, San Jose, CA (US); Daniel A. Steigerwald, Cupertino, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/904,015

(22) Filed: Jul. 11, 2001

(65) Prior Publication Data

US 2003/0010991 A1 Jan. 16, 2003

(51) Int. Cl.[7] .............................................. H01L 33/00
(52) U.S. Cl. .......................................... 257/98; 257/99
(58) Field of Search ................................ 257/13, 98, 99, 257/103, 778

(56) References Cited

U.S. PATENT DOCUMENTS

| | | | | |
|---|---|---|---|---|
| 5,132,750 A | * | 7/1992 | Kato et al. .................... 357/17 |
| 5,410,159 A | * | 4/1995 | Sugawara et al. ............. 257/13 |
| 5,434,434 A | * | 7/1995 | Kasahara et al. ............. 257/84 |
| 5,517,046 A | | 5/1996 | Hsing et al. ................. 257/336 |
| 5,661,074 A | | 8/1997 | Tischler ....................... 438/32 |
| 5,744,829 A | * | 4/1998 | Murasato et al. ............. 257/94 |
| 5,844,275 A | | 12/1998 | Kitamura et al. ........... 257/335 |
| 5,998,232 A | * | 12/1999 | Maruska ....................... 438/46 |
| 6,005,271 A | | 12/1999 | Hshieh ......................... 257/341 |
| 6,133,589 A | * | 10/2000 | Krames et al. ............. 257/103 |
| 6,172,382 B1 | | 1/2001 | Nagahama et al. ........... 257/94 |
| 6,376,864 B1 | * | 4/2001 | Wang ............................ 257/98 |
| 6,252,253 B1 | * | 6/2001 | Bao et al. ..................... 257/89 |
| 6,316,785 B1 | * | 11/2001 | Nunoue et al. ............... 257/14 |
| 6,326,638 B1 | * | 12/2001 | Kamiyama et al. ........... 257/13 |
| 6,330,376 B1 | * | 12/2001 | Paniccia ....................... 385/14 |

FOREIGN PATENT DOCUMENTS

| | | | |
|---|---|---|---|
| DE | 197 56 856 A1 | * | 12/1997 |
| EP | 0 702 414 | * | 1/1995 |
| GB | 2 301 934 A | * | 12/1996 |

OTHER PUBLICATIONS

Sugawara, Hideto et al., "Emission Properties of InGaAIP Visible Light Emitting Diodes . . . " Jpn. J. Appl. Phys. vol. 33 (1994) Part 1, No. 10, Oct. 1994 pp. 5784–5787.*

Chang, S.J. et al., "AIGaInP multiquantum well light–emitting diodes," IEE Proc.—Optoelectron. vol. 144 No. 6, Dec. 1997, pp. 405–409.*

"Recycling of guided mode light emission in planar microcavity light emitting diodes" H. De Neve, et al., *Applied Physics Letters*, vol. 17, No. 7, Feb. 17, 1997, pp. 799–801.

(List continued on next page.)

*Primary Examiner*—Sara Crane
(74) *Attorney, Agent, or Firm*—Patent Law Group LLP

(57) ABSTRACT

The present invention relates to reducing the spatial variation in light output from flipchip LEDs and increasing the consistency in light output from LED to LED in a practical manufacturing process. The present invention introduce appropriate texture into the surface of reflective layer to reduce spatial variation in far-field intensity. At least two reflective planes are provided in the reflective contact parallel to the light emitting region such that at least two interference patterns occur in the light exiting from the LED. The reflective planes are separated by an odd integral multiple of $(\lambda_n/4)$ where $\lambda_n$ is the wavelength of the light in the layer between the active region and the reflective contact, resulting in compensating interference maxima and minima, a more uniform distribution of light, and increased consistency in light output from LED to LED.

15 Claims, 4 Drawing Sheets

OTHER PUBLICATIONS

"Impact of Planar Microcavity Effects on Light Extraction—Part I: Basic Concepts and Analytical Trends" H. Benisty, et al., *IEEE Journal of Quantum Electronics*, vol. 34, No. 9, Sep. 1998, pp. 1612–1631.

"Design and characterization of top–emitting microcavity light–emitting diodes" J.F. Carlin, et al., *Semiconductor Science and Technology*, vol. 15, No. 2, Feb. 2000, pp. 145–154.

* cited by examiner

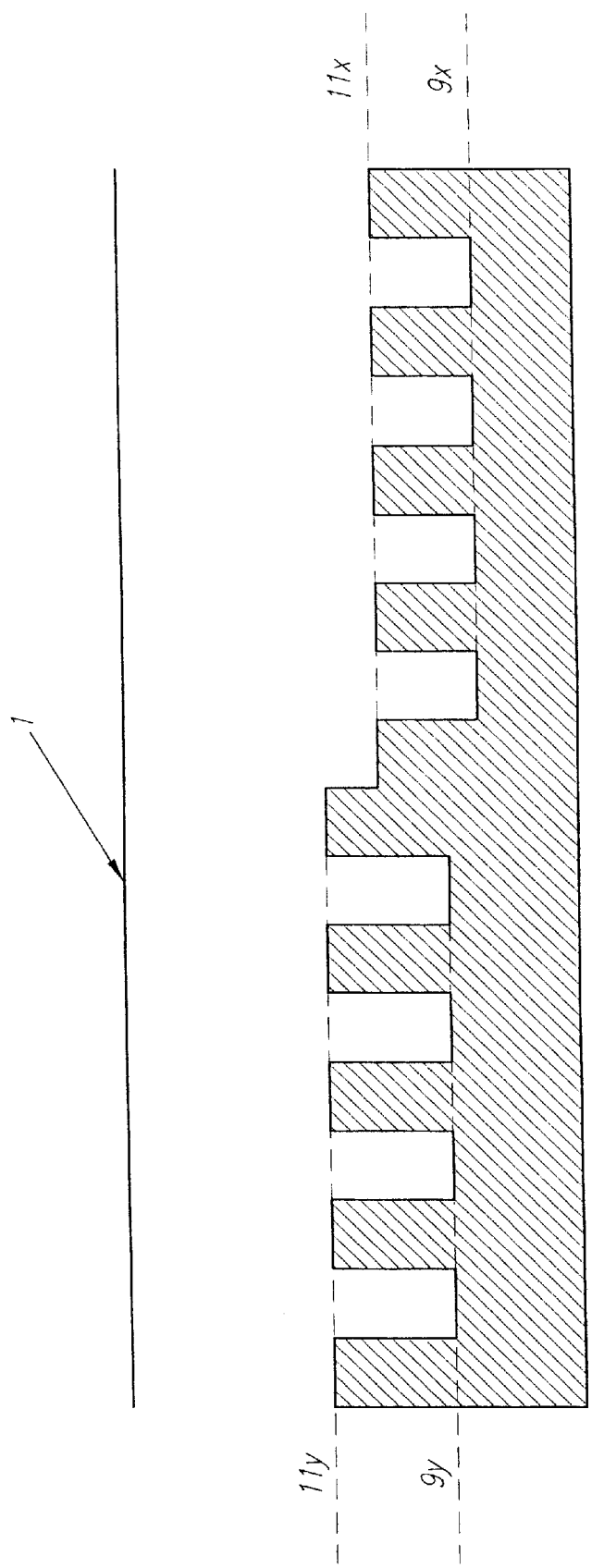

REDUCING THE VARIATION OF FAR-FIELD RADIATION PATTERNS OF FLIPCHIP LIGHT EMITTING DIODES

BACKGROUND

1. Technical Field

The present invention relates to the general field of flipchip light emitting diodes and, more particularly, to reducing the far-field variations in the intensity of radiation emitted from such devices.

2. Description of Related Art

Light emitting diodes ("LEDs") are a highly durable solid state source of light capable of achieving high brightness and having numerous applications including displays, illuminators, indicators, printers, and optical disk readers among others. LEDs are fabricated in several geometric configurations, including a "flipchip" design having a reflective ohmic contact and a second ohmic contact on one face and a substrate transmissive to the LED's emitted light as the opposite face. The ohmic contact having opposite polarity from the reflective contact is located so as not to interfere significantly with the light exiting from the LED. Typically, the reflective ohmic contact is positive and the other contact is negative since the diffusion length of holes (positive charge carriers) in typical LED materials is shorter than the diffusion length of electrons (negative charge carriers). Thus, the less conductive p-layer needs to cover a large area of the LED. The long diffusion length of electrons makes it practical to inject electrons over a restricted surface area by means of a relatively small contact.

Some configurations of flipchip LEDs have the light emitting active region located in close proximity to the reflective contact. In particular, interference patterns occur if the separation of the active region from the reflective contact is less than approximately 50% of the coherence length of the light emitted by the active region. In such cases, light from the active region directly exiting from the LED creates interference patterns with light from the active region exiting from the LED following reflection by the reflective contact. These interference patterns cause spatial variations in the intensity of the light emitted from the LED, particularly in the far-field region.

Far-field intensity variations are detrimental to the performance of a single LED, but a potentially more serious problem is the variation of far-field intensity from LED to LED due to interference patterns. In general, the position, intensity and structure of the interference maxima and minima are functions of the location, reflective properties, planarity and other characteristics of the surfaces and materials the light encounters on its journey from the active region to the far-field region. In particular, modest and random variations in geometry from one LED to another are inherent in any practical LED manufacturing process. Such geometric variations readily cause sizable and largely unpredictable variations in the interference patterns and, hence, in the far-field radiation intensity. Reducing these intensity variations is one objective of the present invention.

The present invention relates to texturing the reflective contact of the LED so as to create at least two distinct interference patterns such that intensity variations caused by the interference patterns tend to compensate intensity minima with intensity maxima. Appropriate texturing results in more uniform patterns of radiation emitted by the LED and a reduction in the variations in far-field intensity from LED to LED.

SUMMARY

The present invention relates to a flipchip LED comprising a light emitting active region having a reflective ohmic contact separated from the active region by one or more layers. Light emitted from electron-hole recombinations occurring in the active region and directly exiting from the LED creates interference patterns with light exiting from the LED following reflection from the reflective contact. The structure of the interference patterns is determined by the structure and materials of the LED, including the spacing from the active region to the reflective contact that is subject to largely unpredictable variation from one LED to another during fabrication. Inconsistent far-field radiation patterns are the undesirable result. The present invention reduces the spatial variation of light emitted from LEDs by introducing appropriate texture into the surface of the reflective layer. At least two reflective planes are provided in the reflective contact parallel to the light emitting region such that a stable interference pattern occurs in the far-field radiation. The set of reflective planes includes at least two planes separated by an odd integral multiple of $(\lambda_n/4)$ where $\lambda_n$ is the wavelength of the light in the layer between the reflecting planes and the active region, resulting in compensating interference maxima and minima, and a more consistent far-field radiation pattern.

DESCRIPTION OF THE DRAWINGS

The drawings herein are not to scale.

FIG. 7: Cross-sectional depiction of reflective layer having multiple reflective planes in two compensating groups.

DETAILED DESCRIPTION

Figure 1:
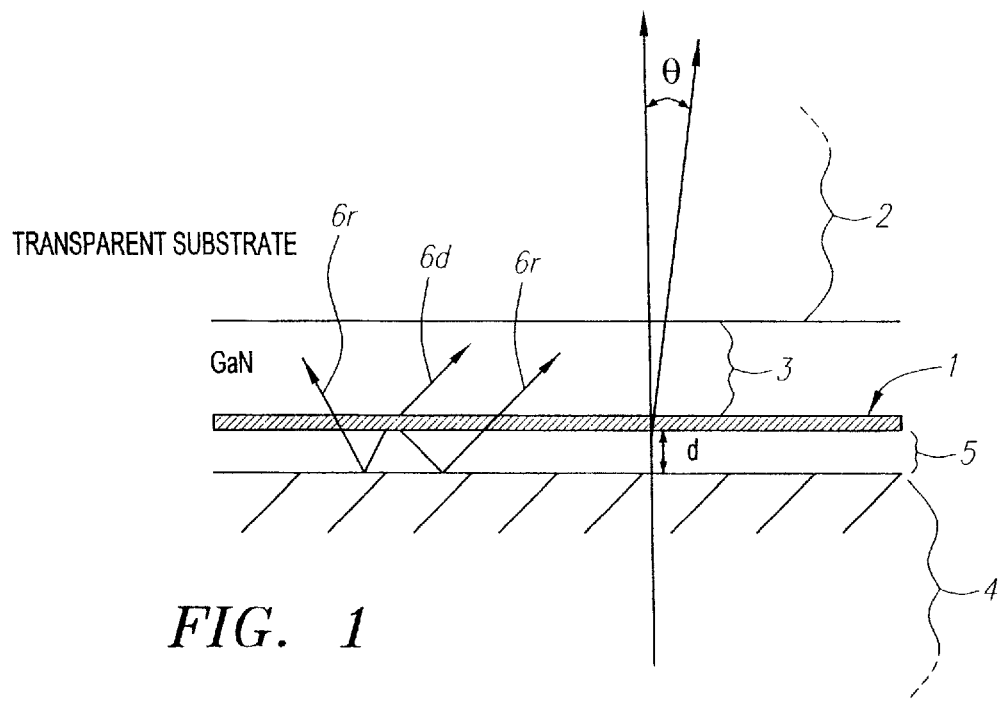
FIG. 1: Cross-sectional depiction of a typical flipchip LED structure including transparent substrate, GaN base layer, light-generating active region, layer adjacent to the ohmic contact with thickness d, and reflective ohmic contact.

FIG. 1 depicts a portion of a typical flipchip LED comprising a light emitting active region 1 and a transparent substrate 2 separated by a base layer 3. We consider the illustrative example of an AlInGaN flipchip LED on a sapphire substrate with a GaN base layer as depicted in FIG. 1. SiC is an example of another transparent substrate that can be used in connection with the present invention, among others. To be definite in our discussion, we describe the common case of flipchip LEDs in which the reflective ohmic contact 4 is the positive contact, recognizing that this is by way of illustration and is not limitation.

A base layer 3, comprising a single layer or one or more constituent sublayers, is typically grown epitaxially on the substrate 2 as a transition region between the substrate and the light emitting active region 1. Typically, Metal-Organic Chemical Vapor Deposition ("MOCVD") is used to grow one or more sublayers comprising the base layer, although other deposition techniques are known and used in the art. For the particular illustrative example of AlInGaN LED's described herein, the base layer is a III-nitride compound, typically including at least one layer of n-doped GaN.

A reflective positive ohmic contact 4 lies at a separation d from active region 1 and with one or more p-type layers 5 lying between the active region and the contact. Layer 5 is not limited to a single layer having uniform composition, electrical or optical properties throughout. Layer 5 can comprise multiple sublayers having distinct compositions, doping characteristics and refractive indices from sublayer to sublayer or a gradation of compositions, electrical properties and optical properties throughout the thickness of layer 5. Layer 5 is not limited to p-type materials. N-type layers can be included as one or more sublayers in layers having overall p-type conductivity, and layers having overall n-type conductivity can also be used. For simplicity of depiction and discussion and not limiting the present invention, we consider a single layer 5 having p-type conductivity.

Light emitted from electron-hole recombinations occurring in the active region 1 can exit from the LED directly (by path 6d, for example) or exit the LED following reflection from ohmic contact 4 such as those beams denoted by 6r. The coherence length for light emitted in 1 is typically around 3 um (um=micrometer=microns=$10^{-6}$ meter) for GaN. While coherence time depends only upon the emission properties of the source of the light, the coherence length depends on the wavelength of the medium through which the light is traveling. Thus, if separation d is less than about 50% of the coherence length (d≦1.5 um) interference between direct and reflected beams occurs, resulting in spatially non-uniform intensity of the light produced by the LED.

Figure 2:
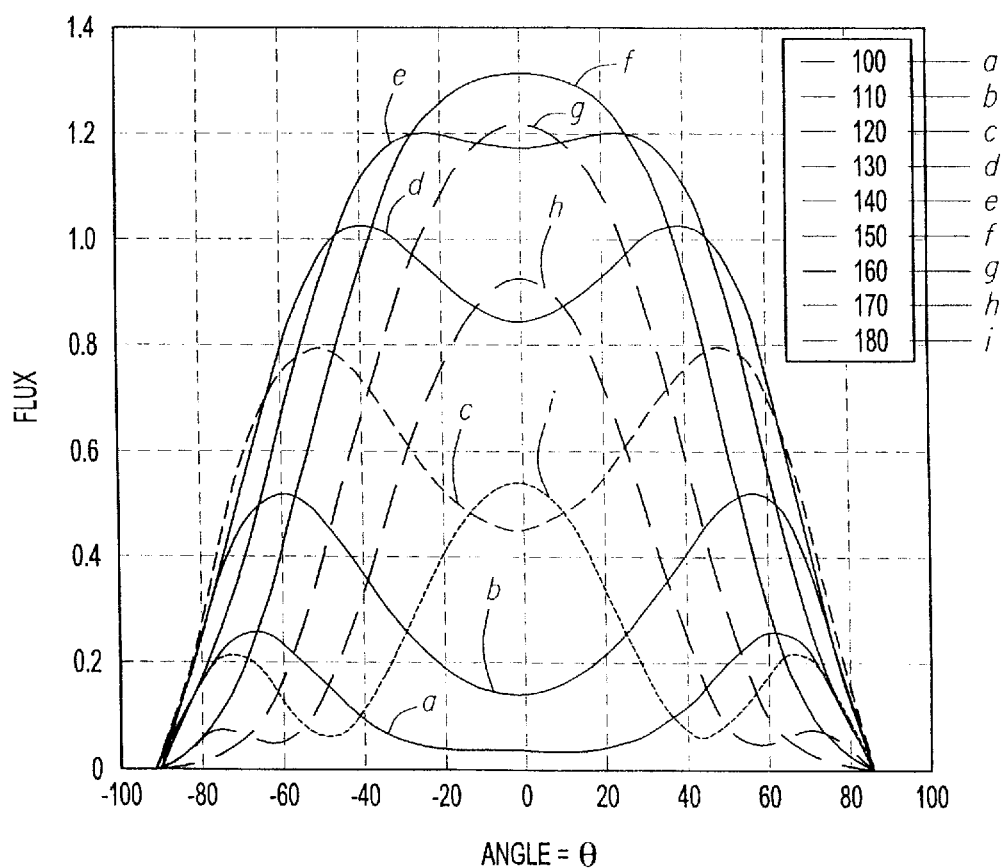
FIG. 2: Angular distribution of the flux of light emitted from the LED depicted in FIG. 1 for different distances, d, as given in the legend (in nanometers). Units of flux are arbitrary.

FIG. 2 depicts computer-generated examples of the far-field emitted light intensity (or flux) as a function of the direction of emission with respect to the normal to the LED, θ, defined in FIG. 1. Various radiation patterns are depicted from curve "a" with d=100 nm to curve "i" with d=180 nm. (nm=nanometer. 1 nm=$10^{-9}$ meter=0.001 um). The units of flux are arbitrary as only the variations of flux with angle are of concern. The radiation patterns depend upon the distance, d, the wavelength of emitted light, the effective indices of refraction of the materials through which the light passes in exiting from the LED, among other factors. The radiation patterns clearly change as d changes.

The present invention reduces the spatial variation of light emitted from LEDs by introducing appropriate texture into the surface of reflective layer 4 in FIG. 1 so as to reduce the intensity variation resulting from interference of direct and reflected beams, 6d and 6r. In practice, it is convenient to introduce the desired texture into the structure of the reflector 4 by etching the surface of p-type layer 5 prior to depositing reflector material thereon. However, any other means for texturing the reflective layer of the LED can also be used in connection with the present invention.

The present invention is not limited to reflection from metal reflective surfaces deposited onto a textured layer, 5. Dielectric spacer layers having a different index of refraction from layer 5 will lead to reflection at the interface, and can also be used in connection with the present invention, as can any other structure leading to more than one reflective layer.

Figure 3:
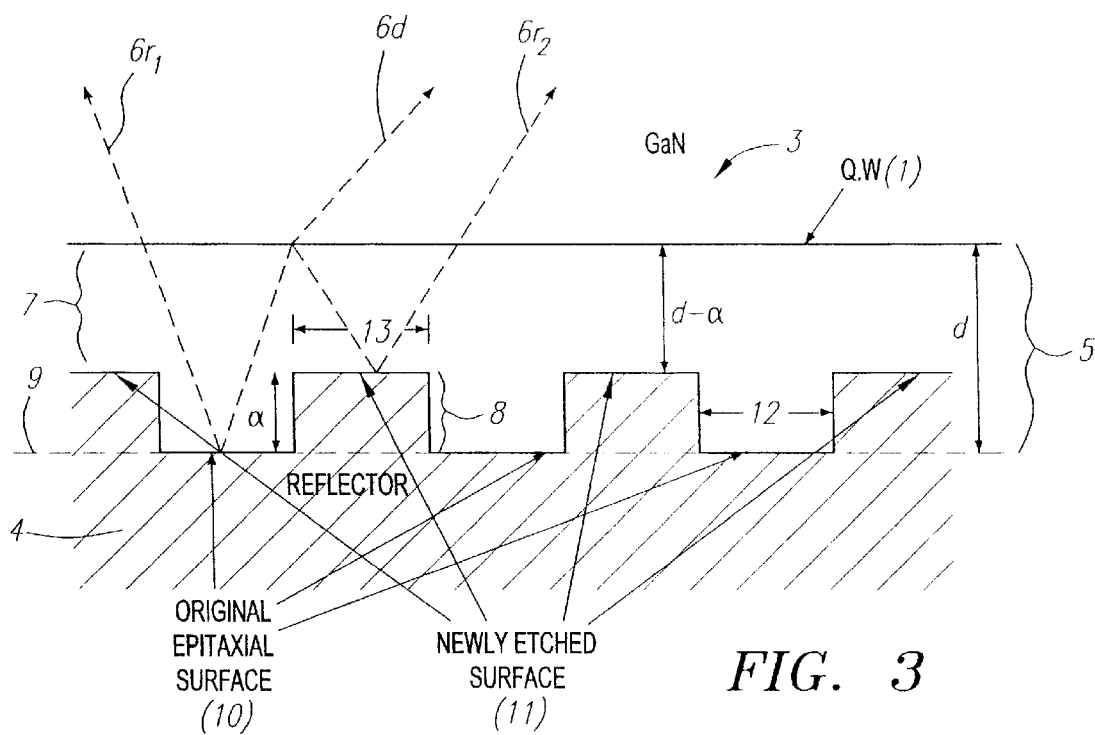
FIG. 3: Cross-sectional depiction of two-level textured reflective contact.

FIG. 3 depicts a cross-sectional view of one family of embodiments in which two level texturing of reflective layer 4 is employed. Surface 9 in these embodiments is the surface of layer 5 prior to etching, having a separation d from active region 1. Etching of layer 5 to a texturing depth a followed by coating with reflective material leads to the two level configuration depicted in cross-section in FIG. 3 with an upper reflective surface 11 ("plateau") and a lower reflective surface 10 ("valley").

FIG. 3 depicts in cross-section the reflective contact 4 having numerous plateau protrusions thereon, 11. The actual protrusions occur in 3-dimensional space. When viewed from the perspective of the active region 1, the texturing plateaus 11 and valleys 10 are seen as 2-dimensional planar areas parallel to the plane of active region 1. These planar reflective areas of contact 4 can have any convenient shape including circular, square, rectangular, elliptical, among others. It is not necessary that the plateaus and/or valleys have the same shape or area from location to location. However, each plateau or valley should be much larger in spatial extent than the wavelength of the radiation in layer 5 but small compared to the total size of the chip. In addition, the total area covered by plateau regions of the reflector is advantageously selected to be equal to the total area of the valley regions. Beneficial reductions of interference effects are obtained even with unequal areas of plateau and valley regions, but equal areas are useful for achieving enhanced uniformity.

Figure 4:
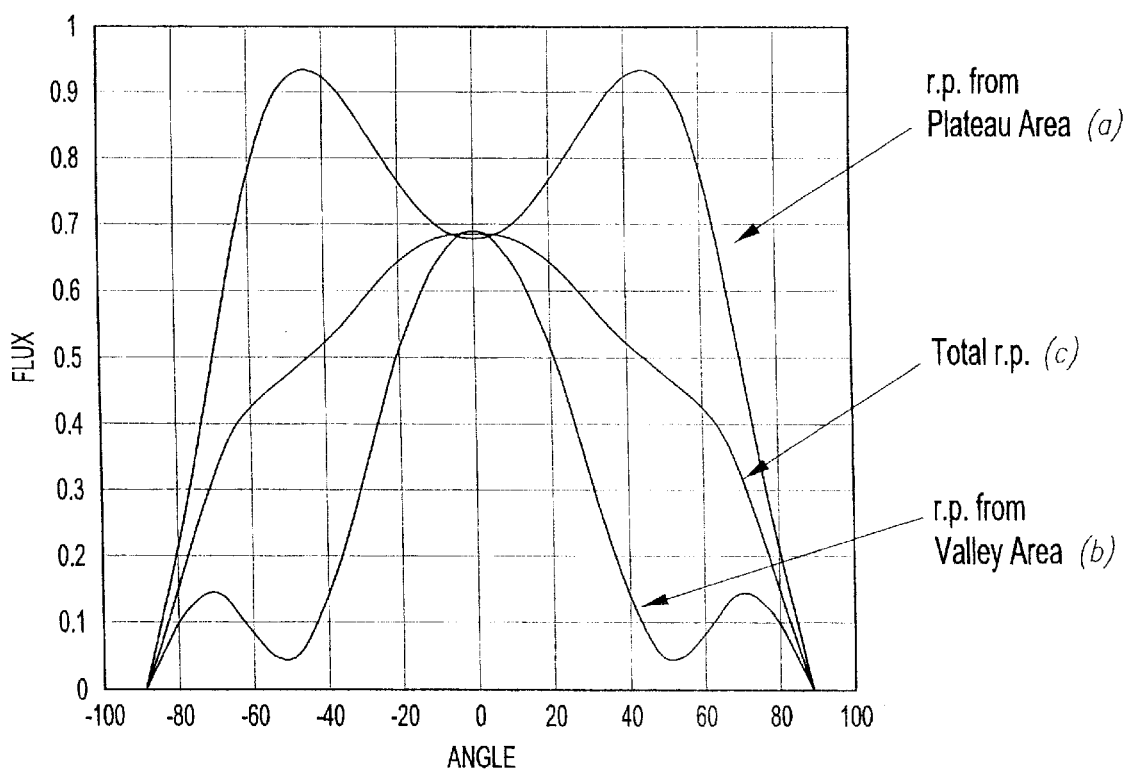
FIG. 4 Angular distribution of the intensity of light emitted from the LED depicted in FIG. 3. Units of flux are arbitrary.

FIG. 4 provides an illustrative example of the calculated light intensity or radiation pattern ("r.p.") emerging from the textured reflective structure depicted in FIG. 3. The depiction in FIG. 4 is given by way of illustration for a typical set of system parameters and not limiting the present invention. For the particular example depicted, d is taken to be 130 nm and the texturing depth α=52 nm. The wavelength emitted by active region 1 in vacuum is λ=500 nm. With an index of refraction for layer 5 of n=2.4, the wavelength in layer 5 is $\lambda_n$=208.33 nm and α=$\lambda_n$/4. FIG. 4 depicts the results for equal areas of plateau and valley reflector regions. Curve a of FIG. 4 depicts the radiation pattern as a function of θ resulting from light reflected from the plateau areas 11 of FIG. 3. Beams $6r_2$ interfering with the directly emitted light 6d produces curve a. Beams 6r, interfering with the directly emitted light 6d produce curve b. The interference maxima of curve a occur at angular locations corresponding approximately to the interference minima of curve b leading to compensation and the overall radiation pattern depicted as curve c. Reduction of the spatial variation in the radiation pattern is clear.

The results of FIG. 4 are obtained for reflections from two planes of the reflective surface (plateau and valley) separated by $\lambda_n$/4 as depicted in FIG. 3. However, the texturing used in connection with the present invention is not limited to two reflective planes nor is the separation between reflective planes limited to $\lambda_n$/4.

Separation Between Reflective Planes for Compensating Interference

Displacing a reflective plane by any multiple $\lambda_n$/2 parallel to the active region changes the path traversed by the light reflecting from such plane and reaching the far-field region by an integral multiple of $\lambda_n$, which does not affect the structure of the interference patterns. Therefore, compensating interference patterns (and a reduction in far-field intensity variation) result when the separation between two reflective planes is an odd integral multiple of $\lambda_n$/4. If two reflective planes are denoted by i and j, and the separation or distance between them denoted by $\alpha_{i,j}$ ($\alpha_{i,j}$>0) compensating interference patterns occur when $\alpha_{i,j}$ satisfies Eq. 1 for the (i,j) pair of reflective planes.

$$\alpha_{i,j}(m) = (2m-1)\lambda_n/4,$$
where m=a positive integer; 1, 2, 3, . . .     Eq. 1 where the dependence on m is made explicit. The case m=1 is depicted in FIG. 3.

Multiple Reflective Planes

Figure 5:
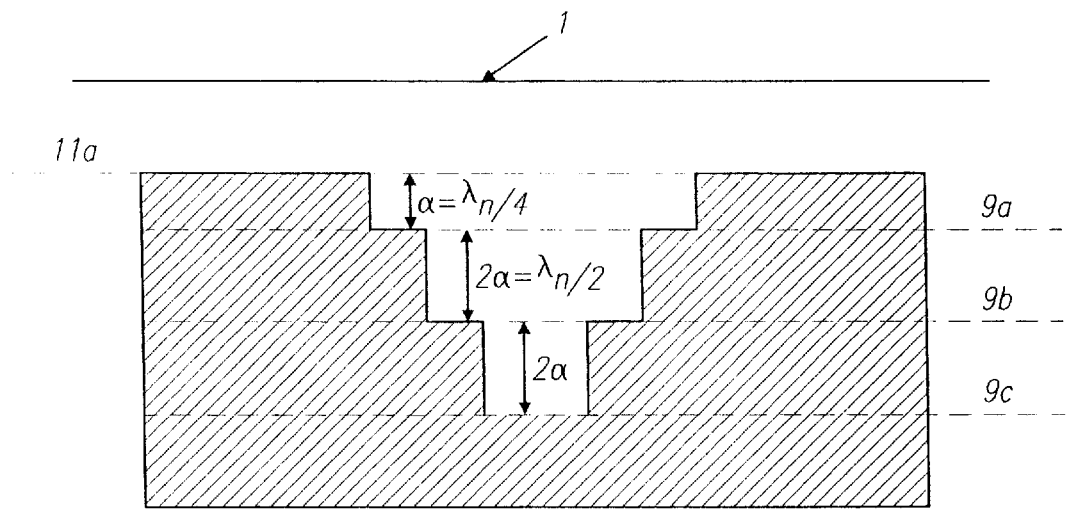
FIG. 5: Cross-sectional depiction of reflective layer having multiple reflective planes.

The valley (and plateau) regions depicted in FIG. 3 need not all lie in a single plane due to the property that displacement of a reflective plane by an integral multiple of $\lambda_n/2$ does not affect that plane's contribution to the interference patterns. For example, the valley regions depicted in FIG. 3 are all depicted as lying in plane 9. FIG. 5 depicts another configuration in which valley regions lie in distinct planes 9a, 9b and 9c separated from each other by an integral multiple of $\lambda_n/2$. Each valley region in FIG. 5 is separated from the plateau regions of plane 11a by an odd multiple of $\lambda_n/4$. Similarly, the plateau regions need not all lie in plane 11 a but can lie in a plurality of plateau planes separated from each other by an integral multiple of $\lambda_n/2$ and, therefore, from each valley plane by an odd multiple of $\lambda_n/4$. Thus, every valley plane i satisfies Eq. 1 with every plateau plane, j for some value of m. Advantageously, the total area of the valley regions should approximately equal the total area of the plateau regions where the summation of valley area (or plateau area) includes all valley planes i (or plateau planes j).

A set of valley planes i and plateau planes j satisfying Eq. 1 we call a compensating group. The simplest example of a compensating group is that depicted in FIG. 3 of one valley plane and one plateau plane. FIG. 5 depicts another form of compensating group consisting of three valley planes 9a, 9b, 9c and one plateau plane 11a. A general compensating group consists of a plurality of valley planes, i, and a plurality of plateau planes, j, satisfying Eq. 1 for all i, j. However, the present invention is not limited to a single compensating group. The texturing of the reflective surface pursuant to the present invention includes the use of one or more compensating groups of reflective planes.

We depict in FIG. 7 the case of two compensating groups, each consisting of one valley plane and one plateau plane. Reflective planes 11y and 9y comprise one compensating group and lead to compensating interference patterns in the manner described above. Reflective planes 9x and 11x are another compensating group and likewise lead to compensating interference patterns in the manner described above. However, as depicted in FIG. 7, the valley planes 9y and 9x, and the associated plateau planes 11y and 11x, can both be employed in the same LED. Considering the planes pairwise, planes 9y and 11y lead to reduction of far-field variations in light intensity, as do planes 9x and 11x. However, there is no restriction on the vertical spacing between the compensating groups. That is, the spacing between plane 9y and 9x in FIG. 7 is arbitrary and need not be a particular fraction or multiple of the wavelength. Each compensating group provides for reduction in far-field intensity variation and, therefore, need not have any particular separation from the planes of any other compensating group.

A plurality of compensating groups can be employed for far-field intensity reduction, not limited to the two depicted in FIG. 7. Additionally, there can be a plurality of valley planes and/or plateau planes within each compensating group having the interplane spacings described above for planes within the group.

The plateau regions and valley regions of the compensating groups can be side-by-side (as in FIG. 7), interleaved, or have any other convenient spatial or geometric relationship.

It is advantageous in the practice of the present invention that the total plateau area be approximately equal to the total valley area within each compensating group regardless of the plateau and valley areas of other compensating groups.

Figure 6:
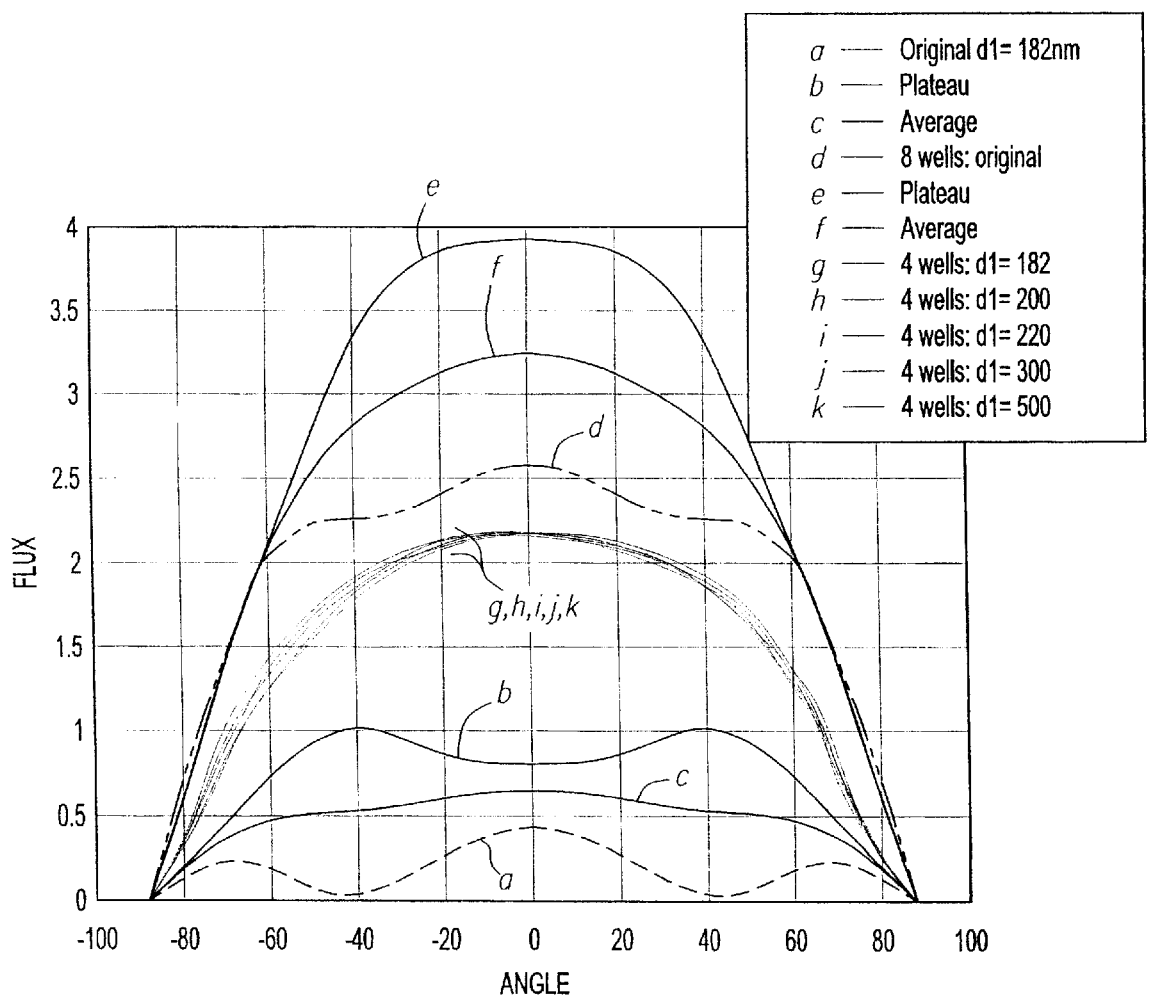
FIG. 6: Angular distribution of the intensity of light emitted from SQW and MQW LEDs. Units of flux are arbitrary.

The present invention is not limited to single quantum well ("SQW") LEDs, but is also applicable to LEDs having multiple quantum well ("MQW") active regions. Radiation patterns are depicted in FIG. 6 for several SQW and MQW configurations. In all cases depicted in FIG. 6 the reflective contact has two-level reflection separated by 25% of the wavelength of the radiation in layer 5 as depicted schematically in FIG. 3. For comparison, curves (a), (b) and (c) are SQW radiation patterns resulting from the plateau regions (curve b), the valley regions (curve a), and the average of the two (curve c), analogous to the depictions of FIG. 4. Curves (d), (e) and (f) relate to 8 MQWs, having 17.5 nm separation between quantum wells ("QWs") and 182 nm from the QW closest to the reflective layer and the lower of the two reflective surfaces, the valley region 10. That is, the distance "d" of FIG. 3 is measured from plane 9 to the lowest of the 8 QWs. Curve (d) is the radiation pattern resulting from the valley reflective surface. Curve (e) is the radiation pattern resulting from the plateau reflective surface. Curve (f) is the average of curves (d) and (e). Curves (g),–(k) relate to a MQW active region having 4 QWs with varying distances d1 from the lowest of the QWs to the lower reflective surface. All other conditions are the same as for other curves of FIG. 6, in particular the spacing between QWs of 17.5 nm. We see that the spacing from the lowest of several QWs to the reflective planes does not significantly affect the uniformity of the radiation pattern. No substantial variation is seen as the spacing between quantum wells is varied.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

We claim:

1. A structure for a flipchip light emitting diode comprising:
   a) a substantially planar light emitting region capable of emitting radiation of wavelength $\lambda_n$ therefrom; and,
   b) at least one compensating group of reflecting planes wherein each of said at least one compensating group comprises:
     i) at least one plateau region having at least one plateau surface substantially parallel to the plane of said light emitting region and reflective of at least a portion of said radiation, wherein said at least one plateau surface lies in at least one plateau plane, and wherein the separation of each of said at least one plateau plane from every other plateau plane is an integral multiple of $(\lambda_n/2)$; and,
     ii) at least one valley region having at least one valley surface substantially parallel to the plane of said light emitting region and reflective of at least a portion of said radiation, wherein said at least one valley surface lies in at least one valley plane, and wherein the separation of each of said at least one valley plane from every other valley plane is an integral multiple of $(\lambda_n/2)$; and,
     iii) wherein the separation of each of said valley planes from each of said plateau planes is an odd integral multiple of $(\lambda_n/4)$.

2. A structure as in claim 1 wherein the total area of said at least one plateau surface and the total area of said at least one valley surface within each of said at least one compensating group are substantially equal.

3. A structure as in claim 1 wherein said at least one compensating group comprises a single compensating group.

4. A structure as in claim 3 wherein said at least one plateau plane lies in substantially the same plane.

5. A structure as in claim 3 wherein said at least one valley plane lies in substantially the same plane.

6. A structure as in claim 3 wherein said at least one surface of said at least one plateau region is metal.

7. A structure as in claim 3 wherein said at least one surface of said at least one valley region is metal.

8. A method of reducing the variation of far-field radiation patterns of flipchip light emitting diodes comprising providing a light emitting diode including:
   a) a substantially planar light emitting region capable of emitting radiation of wavelength $\lambda_n$ therefrom; and,
   b) at least one compensating group of reflecting planes wherein each of said at least one compensating group comprises:
      i) at least one plateau region having at least one plateau surface substantially parallel to the plane of said light emitting region and reflective of at least a portion of said radiation, wherein said at least one plateau surface lies in at least one plateau plane, and wherein the separation of each of said at least one plateau plane from every other plateau plane is an integral multiple of $(\lambda_n/2)$; and,
      ii) at least one valley region having at least one valley surface substantially parallel to the plane of said light emitting region and reflective of at least a portion of said radiation, wherein said at least one valley surface lies in at least one valley plane, and wherein the separation of each of said at least one valley plane from every other valley plane is an integral multiple of $(\lambda_n/2)$; and,
      iii) wherein the separation of each of said valley planes from each of said plateau planes is an odd integral multiple of $(\lambda_n/4)$.

9. A method as in claim 8 wherein the total area of said at least one plateau surface and the total area of said at least one valley surface within each of said at least one compensating group are substantially equal.

10. A method as in claim 8 wherein said at least one compensating group comprises a single compensating group.

11. A method as in claim 10 wherein said at least one plateau plane lies in substantially the same plane.

12. A method as in claim 10 wherein said at least one valley plane lies in substantially the same plane.

13. A method as in claim 10 wherein said at least one surface of said at least one plateau region is metal.

14. A method as in claim 10 wherein said at least one surface of said at least one valley region is metal.

15. Radiation as an article of manufacture wherein said radiation is produced by the method of claim 8.

* * * * *